(12) United States Patent
Yumi

(10) Patent No.: US 8,475,180 B2
(45) Date of Patent: Jul. 2, 2013

(54) CONDUCTIVE COMPONENT

(75) Inventor: Hideo Yumi, Kasugai (JP)

(73) Assignee: Kitagawa Industries Co., Ltd, Naka-ku, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 13/145,267

(22) PCT Filed: Nov. 4, 2010

(86) PCT No.: PCT/JP2010/069615
§ 371 (c)(1),
(2), (4) Date: Jul. 19, 2011

(87) PCT Pub. No.: WO2011/055752
PCT Pub. Date: May 12, 2011

(65) Prior Publication Data
US 2011/0284263 A1    Nov. 24, 2011

(30) Foreign Application Priority Data

Nov. 4, 2009    (JP) ................................. 2009-253317

(51) Int. Cl.
*H01R 12/00*    (2006.01)
(52) U.S. Cl.
USPC ................................. 439/66; 439/591; 439/91
(58) Field of Classification Search
USPC ............................................. 439/66, 91, 591
See application file for complete search history.

(56) References Cited

U.S. PATENT DOCUMENTS

| | | | |
|---|---|---|---|
| 3,951,493 A * | 4/1976 | Kozel et al. ................... 439/591 |
| 4,857,668 A * | 8/1989 | Buonanno ...................... 174/354 |
| 4,952,156 A * | 8/1990 | Schmedding .................... 439/66 |
| 4,988,306 A * | 1/1991 | Hopfer et al. .................... 439/66 |
| 5,142,101 A * | 8/1992 | Matsuzaki et al. ............. 174/354 |
| 6,239,386 B1 * | 5/2001 | DiStefano et al. ............. 174/262 |
| 7,393,214 B2 * | 7/2008 | DiStefano ........................ 439/66 |
| D595,652 S * | 7/2009 | Di Stefano ................... D13/133 |
| 7,559,770 B2 * | 7/2009 | Di Stefano ........................ 439/66 |
| 7,837,476 B2 * | 11/2010 | Di Stefano ...................... 439/66 |
| 7,938,697 B2 | 5/2011 | Inaba et al. |
| 2004/0106327 A1 * | 6/2004 | Baker ........................... 439/654 |

(Continued)

FOREIGN PATENT DOCUMENTS

| JP | 9-115574 A | 5/1997 |
|---|---|---|
| JP | 2006-140008 A | 8/2006 |
| JP | 2008-15307 A | 7/2008 |

OTHER PUBLICATIONS

Form PCT/IB/338, Date of Mailing Jun. 21, 2012.
Form PCT/IB/373, Date of Issuance Jun. 12, 2012.
Translation of Form PCT/IB/237, Date of Mailing Jun. 12, 2010.

*Primary Examiner* — Briggitte R Hammond
(74) *Attorney, Agent, or Firm* — Davis & Bujold, PLLC

(57) ABSTRACT

A conductive component includes a tubular body having at least one of at least one through-hole which penetrates the tubular body from outside to inside thereof; and at least one notch which is cut in from an edge of the tubular body, which are formed at least one predetermined portion on the tubular body. The tubular body includes a first portion, which includes a solder joint portion, and a second portion, which includes a contact portion. The first portion and the second portion are located on the opposite sides from one another with the at least one predetermined portion sandwiched therebetween. The tubular body further includes at least one spring portion which includes the at least one predetermined portion.

16 Claims, 4 Drawing Sheets

U.S. PATENT DOCUMENTS

2005/0277306 A1* 12/2005 Millard et al. .................. 439/10
2007/0269999 A1* 11/2007 Di Stefano ...................... 439/73
2010/0022105 A1* 1/2010 Di Stefano ...................... 439/66

* cited by examiner

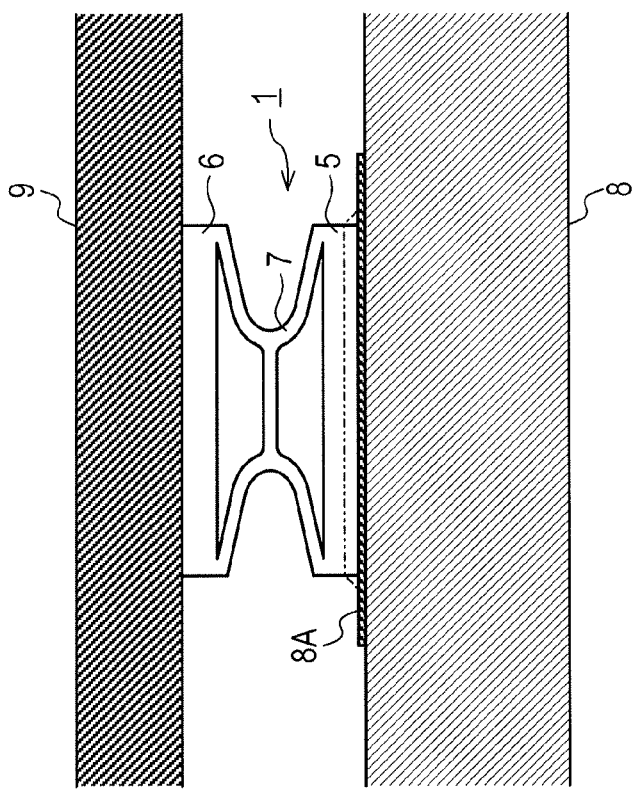
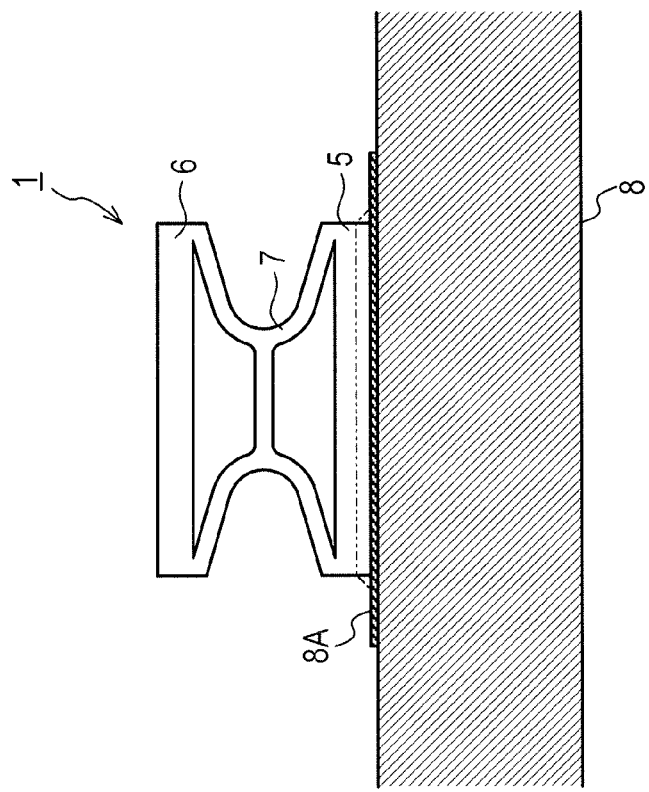

CONDUCTIVE COMPONENT

CROSS-REFERENCE TO RELATED APPLICATIONS

This international application claims the priority benefit of Japanese Patent Application No. 2009-253317 filed Nov. 4, 2009 in the Japan Patent Office, the entire disclosure of which is incorporated herein by reference.

TECHNICAL FIELD

The present invention relates to a conductive component that electrically connects two members when sandwiched therebetween.

BACKGROUND ART

There is a conventional conductive component that is joined to one of two members by soldering and contacts the other of the two members, thereby to form a conductive path between the two members. An example of such conductive components, which is disclosed in Patent Literature 1, for example, is formed by bending a component punched out of a thin metal plate.

This kind of conductive component is surface-mounted, for example, on a printed wiring board (corresponding to the above-described one member), and utilized when brought into conduction with another printed wiring board, a shield board, or a chassis (each corresponding to the other member).

PRIOR ART LITERATURE

Patent Literature

Patent Literature 1: Unexamined Japanese Patent Application Publication No. H09-115574

SUMMARY OF THE INVENTION

Problems to be Solved by the Invention

Since a mobile device such as a cellular phone has been significantly reduced in size and weight, a clearance between a printed wiring board and a housing has become extremely small. Therefore, when electrically connecting the printed wiring board and the housing by arranging a conductive component in such a clearance, an extremely small conductive component, especially, a low-profile conductive component with an extremely small size in the height direction, is required.

Even if the distance between the two members is designed to be 0 mm, some clearance may be produced between the two members. When electrically connecting such two members, the above-described low-profile conductive component is also required.

However, in processing a conductive component that has a structure with a spring portion formed by folding back a metal plate as described in the above Patent Literature 1, and that is very small in the height direction, the spring portion has to be folded back in an excessively small radius of curvature when the spring portion is folded back into an approximately V-shape relative to a solder joint portion.

Therefore, the spring portion has a tendency to easily break at the folded-back part when the spring portion is folded back excessively as above. Consequently, such a fragile spring portion could break when an electronic equipment with the conductive component mounted therein receives some impact or when some distortion occurs at a section to which the conductive component is mounted.

Instead of folding back the metal plate into an approximately V-shape in such a manner that a valley-folded portion of the folded-back part makes an acute angle as described above, in some structures, part of the metal plate is cut and raised in such a manner that a valley-folded portion of the folded-back part makes an obtuse angle, and the cut-and-raised part is brought into contact with an other portion.

However, since such a cut-and-raised spring is not excellent in resilience, a very big stroke cannot be secured, and a problem thereby arises in that it is difficult to secure a sufficiently high contact pressure.

The present invention has been made to solve the foregoing problems, and an object of the invention is to provide a conductive component that can exhibit sufficiently high contact pressure, despite being a low-profile conductive component with a suppressed size in the height direction.

Means for Solving the Problems

Structures adopted in the present invention are described hereafter.

A conductive component according to a first aspect of the present invention is a conductive component that electrically connects two members when sandwiched therebetween. The conductive component includes a tubular body having at least one of at least one through-hole which penetrates the tubular body from outside to inside thereof; and at least one notch which is cut in from an edge of the tubular body, formed at least one predetermined portion of the tubular body.

The tubular body includes a first portion, a second portion, and at least one spring portion. The first portion and the second portion are located on the opposite sides to each other with the at least one predetermined portion sandwiched therebetween. The first portion includes a solder joint portion which is joined to one of the two members by soldering. The second portion includes a contact portion which contacts the other of the two members. The at least one spring portion includes the at least one predetermined portion, and when the contact portion is displaced by being pressed from the other member to a side of the solder joint portion, the at least one spring portion is elastically deformed to make the contact portion press-contacted to the other member.

In the above conductive component, the at least one of the at least one through-hole and the at least one notch is formed at the at least one predetermined portion of the tubular body and, by forming the remaining portion into a narrow shape such as a straight line and a curved line, stiffness is lowered and the remaining portion becomes elastically deformed easily, which provides the remaining portion with a spring property. The portion provided with such a spring property is made to be the spring portion and, among portions located at each side of the spring portion, one portion constitutes the solder joint portion, and the other portion constitutes the contact portion.

Consequently, according to the conductive component configured as such, processing such as folding back part of a cylindrical body at a portion to be the spring portion is unnecessary. Therefore, unlike the conductive component having the configuration in which the spring portion is formed by bending a metal plate such that the metal plate is folded back, the problem that the spring portion easily breaks at the folded-back part is suppressed from occurring.

Further, compared with the folded-back-type spring portion and the cut-and-raised-type spring portion, the tubular body is allowed to have high stiffness due to its configuration. Therefore, when the conductive component formed of such a tubular body is sandwiched, sufficiently high contact pressure can be easily secured.

Besides, by changing a size and shape of the through-hole or the notch as appropriate, the line width and design of the remaining portion can be variously changed, so that the stiffness of the spring portion can be controlled. As a result, the contact pressure of the conductive component can be lowered from the sufficiently high level to a desired level to promote optimization of the contact pressure.

In a state where the tubular body is disposed with the solder joint portion facing downward and the contact portion facing upward, the at least one through-hole or the at least one notch is to be formed on the side of the tubular body. Therefore, taking into consideration the fact that molten solder is raised at the solder joint portion due to surface tension, the at least one through-hole or the at least one notch can be formed at a position where the raised solder does not reach the spring portion. Accordingly, it is also possible to inhibit the solder raised due to surface tension from interfering with spring property of the spring portion, unlike the spring portion configured to stand up directly from the portion of the solder joint portion.

Moreover, in the spring portion configured in such a manner that one end is a fixed end and the other end is a free end which is displaceable more than the one end, certain kinds of things (e.g., operator's fingers) could be easily caught on the free end side, which is likely to result in troubles such as plastic deformation on the fixed end side of the spring portion. In contrast, in the present invention, the at least one predetermined portion of the tubular body constitutes the at least one spring portion and, therefore, a possibility that certain kinds of things are caught is lowered compared with the spring portion having a protruding free end. As a result, improvement in workability, productivity, and the like can be expected.

In the conductive component as described above, the tubular body may be made of any material as long as the tubular body functions as a conductive component with no problem. To give a typical example, the tubular body may be configured utilizing a metal tubular body. Alternatively, as long as required stiffness, elasticity, and the like can be secured, the tubular body may be formed of conductive resin material, or a tubular body obtained by coating a surface of a tubular body, which is formed of material with no or low conductivity, with conductive material (e.g., a tubular body made by depositing a metal layer on a base material of engineering plastic) may be used.

In the conductive component, the tubular body may be either of the followings: a tubular body having a closed cross-sectional shape, in which there is no open ring portion on the cross-section perpendicular to a penetration direction of an inner opening (e.g., a cylindrical body with an O-shaped cross-section); or a tubular body having an open cross-sectional shape, in which there is an open ring portion on the cross-section perpendicular to the penetration direction of the inner opening (e.g., a cylindrical body with a C-shaped cross-section).

When the tubular body having an open cross-sectional shape is utilized, although the open ring portion cannot function as a spring portion, there is no problem in allowing the open ring portion to be the solder joint portion or the contact portion. Even when the open ring portion is not made to be the solder joint portion or the contact portion, there arises no problem as long as the function as a spring portion is secured by other portions.

Further, in the conductive component, although the cross-section of the tubular body may have any shape, it is preferable that, when the conductive component is disposed with the solder joint portion in contact with the printed circuit board, the conductive component can maintain such a state by itself without any special assistance from other means. Specifically, the cross-sectional shape is preferably elliptical, trapezoidal, rectangular, square, and the like.

As for the at least one spring portion, all that required is that the contact portion is press-contacted to the other member with elastic deformation. More preferably, as in a conductive component according to a second aspect of the present invention, in a state where the tubular body is disposed with the solder joint portion facing downward, the contact portion facing upward, and both ends of the tubular body facing to the right and to the left respectively, at least one of at least one through-hole and at least one notch may be formed on both portions located at a front and at a rear of the tubular body, so that each of the both portions located at the front and at the rear becomes the at least one spring portion.

In such a conductive component, spring portions are interposed both between the front ends of the contact portion and the solder joint portion and between the rear ends of the contact portion and the solder joint portion. Therefore, such a conductive component can suppress an inclination of the contact portion from varying when the contact portion is displaced toward the solder joint portion side, compared with a configuration in which the spring portion is interposed between either one of the front ends of the contact portion and the solder joint portion or the rear ends of the contact portion and the solder joint portion. As a result, the conductive component can maintain a stable contact state with the other member.

As in a conductive component according to a third aspect of the present invention, in a state where the tubular body is disposed with the solder joint portion facing downward and the contact portion facing upward, the tubular body may have a rotationally symmetrical configuration with an axis line extending in a vertical direction as a center of symmetry. Particularly, as in a conductive component according to a fourth aspect of the present invention, it is preferable that the central portion of the contact portion as viewed from above the tubular body is a suction surface that is attracted by a suction nozzle provided on an automatic mounting device when mounting is performed with the automatic mounting device. Further, as in a conductive component according to a fifth aspect of the present invention, the suction surface may be a curved surface corresponding to a side portion of the cylindrical body, which has either one of a circular shape and an elliptical shape in cross-section perpendicular to an axial direction.

In the conductive component according to the third aspect, in a state where the tubular body is disposed with the solder joint portion facing downward and the contact portion facing upward, the center of gravity of the conductive component is positioned in the center of the tubular body as viewed from thereabove. Accordingly, in a case where the conductive component of the third aspect is configured in the same manner as in the conductive component of the fourth aspect, when the conductive component is surface-mounted on the printed wiring board with the automatic mounting device, it is possible to take the conductive component out of a packaging container such as an embossed tape by attracting the conductive component with the suction nozzle of the automatic mounting device utilizing the suction surface positioned in the center of the tubular body as viewed from thereabove. Consequently, compared with a conductive component having a suction surface in the vicinity of an end portion which is off the position of the center of gravity near the center of the tubular body, the above conductive component is excellent in stability when taken out with the suction nozzle, which contributes to improvement in mounting rate.

As described above, since the conductive component is excellent in stability when taken out of the packaging container with the suction nozzle, the suction surface can be a curved surface as in the conductive component of the fifth aspect, not to mention a flat surface. Therefore, even when the conductive component is extremely small (e.g., less than 1 mm in the height direction), mechanical strength inherent in a cylindrical body can be secured.

As in a conductive component according to a sixth aspect of the present invention, the first portion and the second portion on the tubular body may have the same shape. With such a structure, the solder joint portion and the contact portion may be replaced with each other and, therefore, when the conductive component is stored in the packaging container such as an embossed tape, it becomes possible to perform a storing task without paying excessive attention to a storing direction of the conductive component. As a result, such a conductive component contributes to improvement in productivity.

As in a conductive component according to a seventh aspect of the present invention, the conductive component of the present invention may further include an elastic body, which is formed of one of elastomeric material and foamed material and disposed inside the tubular body.

Such an elastic body can be disposed inside the through-hole in various manners as follows: by press-fitting the elastic body such as elastomer and sponge after forming a through-hole on an outer peripheral surface of the tubular body; by setting the tubular body in a die after forming a through-hole on an outer periphery of the tubular body and then injecting material composition, which becomes elastic body such as elastomer and sponge, into the die; or by forming an elastic body such as elastomer and then wrapping a thin plate (e.g., a metal plate with a through-hole processed thereon), which is to be formed into a tubular body, around the elastic body.

By disposing such an elastic body inside the tubular body, the tubular body is supported by the elastic body from inside thereof. As a result, more stable contact pressure is applied to a contact portion between the conductive component and the other member, and electrical properties are thereby stabilized while the conductive component is in use.

Moreover, in the conductive component of the present invention, the at least one of the at least one through-hole and the at least one notch, which is formed on the at least one spring portion, may be formed in any manner. By way of example, as in a conductive component according to an eighth aspect of the present invention, it is preferable that the tubular body is of metal and that the at least one of the at least one through-hole and the at least one notch is formed with a press machine. Alternatively, as in a conductive component according to a ninth aspect of the present invention, the tubular body may be of metal and the at least one of the at least one through-hole and the at least one notch may be formed with a laser beam machine.

When the tubular body is processed with the press machine, a cylindrical body, into which a core material is inserted in advance, may be punched by press working, or a flat plate punched by press working may be rolled up into a cylindrical shape. Forming the conductive component by press working as above makes it possible to suppress costs of manufacturing the conductive component compared with a case where the laser beam machine is used.

On the other hand, if the tubular body is processed with the laser beam machine, the through-hole or the notch can be formed with extremely high accuracy even if the conductive component is very small. Therefore, optimization of stiffness or elasticity in the spring portion can be easily promoted by carefully adjusting a size and shape of the through-hole or the notch in accordance with required performance. Further, when the tubular body is processed with the laser beam machine, it does not happen that stress is left in a bent portion as in the case of press working. Instead, even if residual stress has been generated for some reason when the tubular body is heated at a severed portion, the stress can even be relaxed.

BRIEF DESCRIPTION OF THE DRAWINGS

FIG. 1A is a perspective view of the conductive component, FIG. 1B is a plan view of the conductive component, FIG. 1C is a front view of the conductive component, and FIG. 1D is a right side view of the conductive component.

FIGS. 2A-2B are diagrams showing usage examples of the conductive component exemplified as the embodiment of the present invention: FIG. 2A is an explanatory diagram showing a state in which the conductive component is joined to a printed wiring board by soldering, and FIG. 2B is an explanatory diagram showing a state in which the conductive component is sandwiched between the printed wiring board and a separate conductive panel.

FIG. 4A is a plan view of the conductive component, FIG. 4B is a front view of the conductive component, FIG. 4C is a right side view of the conductive component, and FIG. 4D is a bottom view of the conductive component.

EXPLANATION OF REFERENTIAL NUMERALS 1, 11, 21, 31, 41, 51, 61, 71, 81, 91, 101, 111 . . . conductive component; 3 . . . tubular body; 3A . . . notch; 3B . . . through-hole; 5, 115 . . . joint portion; 6, 116 . . . contact portion; 7, 17, 27, 37, 47, 57, 67, 77, 87, 97, 107, 117 . . . spring portion; 8 . . . printed wiring board; 8A . . . wiring pattern; 9 . . . panel; 115A . . . open ring portion

MODES FOR CARRYING OUT THE INVENTION

Embodiments of the present invention is described below with examples.

Figure 1A:
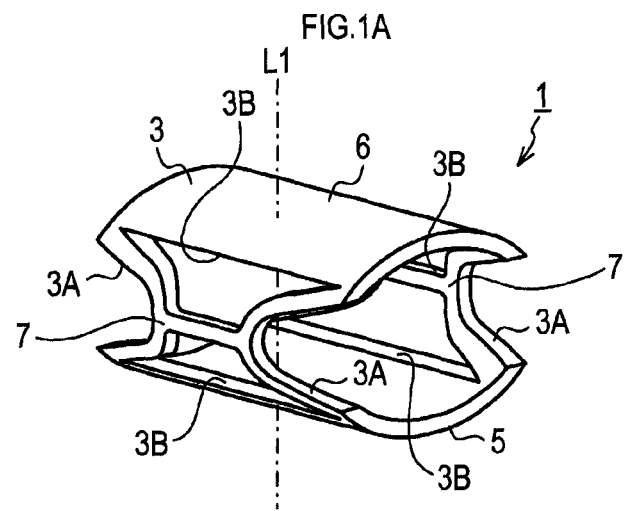
FIGS. 1A-1D are views showing a conductive component exemplified as an embodiment of the present invention.
Figure 1B:
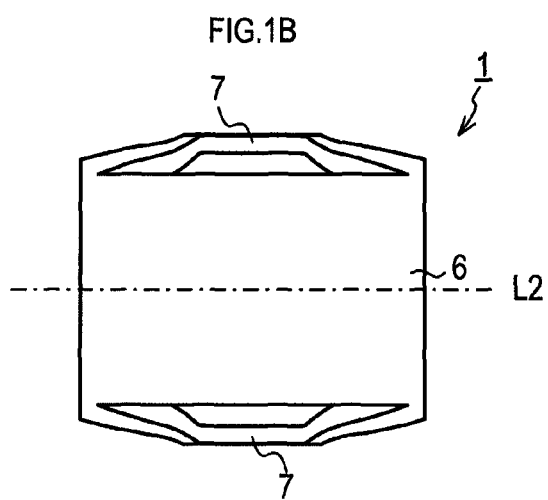
Figure 1C:
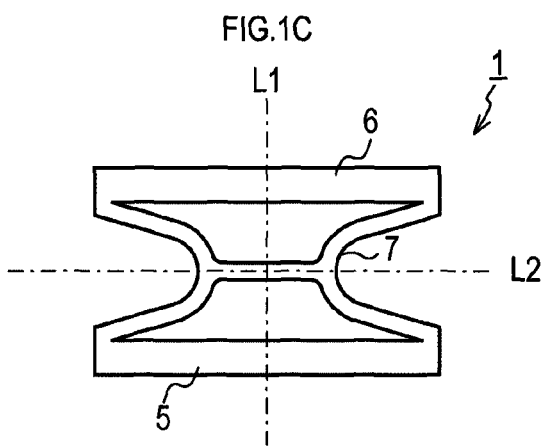
Figure 1D:
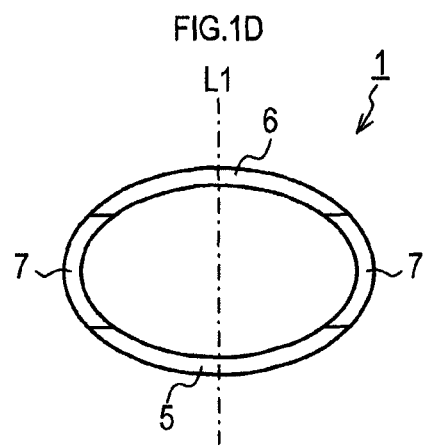
Figure 3A:
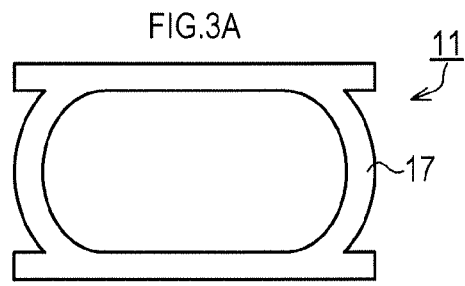
FIGS. 3A-3J are explanatory diagrams illustrating ten types of specific configurations of a spring portion.
Figure 3B:
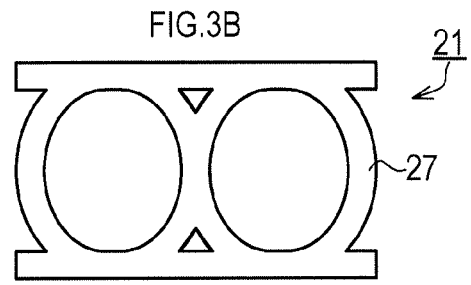
Figure 3C:
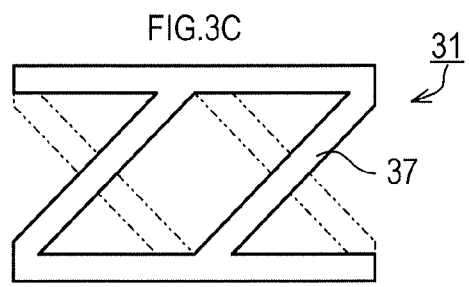
Figure 3D:
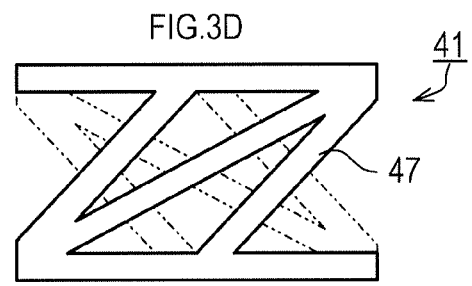
Figure 3E:
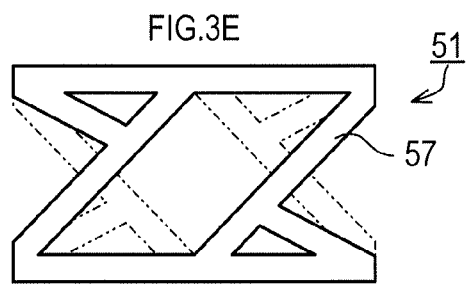
Figure 3F:
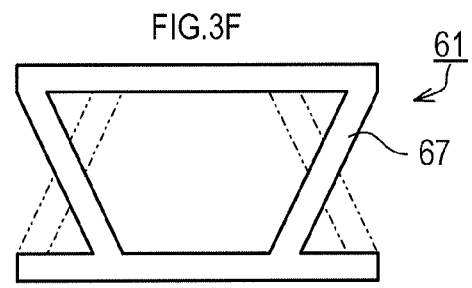
Figure 3G:
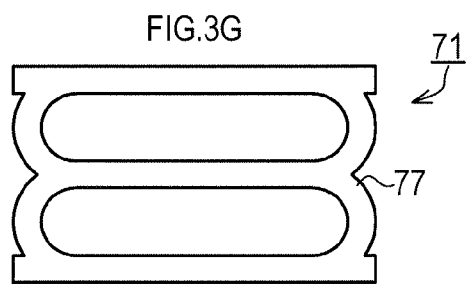
Figure 3H:
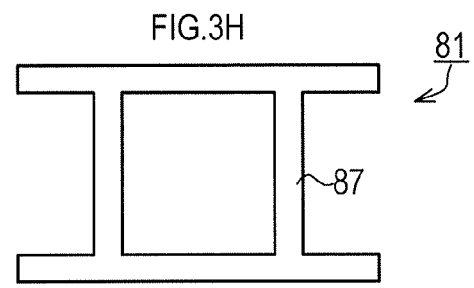
Figure 3I:
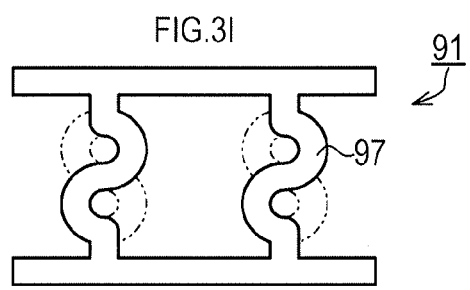
Figure 3J:
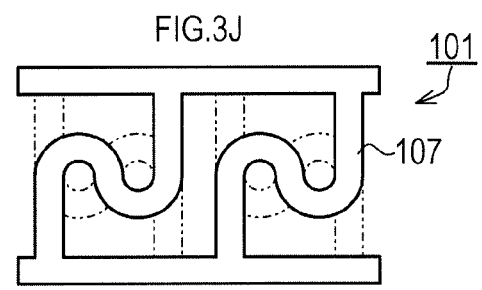

FIGS. 1A-1D are views showing a conductive component 1 exemplified as an embodiment of the present invention. FIG. 1A is a perspective view of the conductive component 1, FIG. 1B is a plan view of the conductive component 1, FIG. 1C is a front view of the conductive component 1, and FIG. 1D is a right side view of the conductive component 1. A rear view of the conductive component 1 is identical with the front view thereof, a left side view thereof is identical with the right side view thereof, and a bottom view thereof is identical with the plan view thereof.

The conductive component 1 has a structure in which four notches 3A (only three notches 3A are explicitly illustrated in FIG. 1A) and four through-holes 3B are formed on a metal tubular body 3 with a laser beam machine. By forming the four notches 3A and the four through-holes, a solder joint portion 5, a contact portion 6, and a pair of spring portions 7, 7 are formed on the conductive component 1.

More specifically, the pair of the spring portions 7, 7 is composed of a remaining portion left after forming the notches 3A and the through-holes 3B, and a configuration of the pair of the spring portions 7, 7 is a combination of linear or curved narrow parts. By forming the pair of the spring portions 7, 7 into such a configuration, stiffness of the pair of the spring portions 7, 7 is decreased compared with that of the solder joint portion 5 and the contact portion 6, which do not include the notches 3A and the through-holes 3B. Therefore, when external force is applied to the conductive component 1, the conductive component 1 is elastically deformed easily at the pair of the spring portions 7, 7.

In a state where the conductive component 1 is disposed with the solder joint portion 5 facing downward and the contact portion 6 facing upward, the conductive component 1 has a rotationally symmetrical configuration with an axis line L1 extending in a vertical direction as a center of symmetry (see FIG. 1B). Further, in the conductive component 1, a portion to become the solder joint portion 5 and a portion to become the contact portion 6 have the same shape and, therefore, even if the solder joint portion 5 and the contact portion 6 are replaced with each other, the conductive component 1 can be used without any problem.

The conductive component 1 configured as above is disposed on a printed wiring board with an automatic mounting device (not shown). In such a process, an outer side of the contact portion 6 serves as a suction surface, which is utilized to attract the conductive component 1 by a suction nozzle of the automatic mounting device and to take the conductive component 1 out of a packaging container such as an embossed tape. As shown in FIG. 1B, since the conductive component 1 has a rotationally symmetrical configuration as viewed from above the tubular body 3 (i.e., the conductive component 1), the center of gravity of the conductive component 1 is located in the center of the conductive component 1. Accordingly, the conductive component can be attracted by the suction nozzle of the automatic mounting device by utilizing the suction surface positioned in the center of the tubular body 3 as viewed from thereabove.

Consequently, compared with a conductive component having a suction surface in the vicinity of an end portion which is off the position of the center of gravity near the center of the conductive component, the conductive component 1 is excellent in stability when taken out of the packaging container with the suction nozzle, which contributes to improvement in mounting rate.

After the conductive component 1 is disposed on the printed wiring board with the above automatic mounting device, the conductive component 1 is joined to a wiring pattern 8A of a printed wiring board 8 by soldering as shown in FIG. 2A, for example.

In such a process, when a cream solder applied on the wiring pattern 8A is molten, the solder is raised, in some cases, to a position indicated by a chain double-dashed line in FIG. 2A due to surface tension of the molten solder. However, in the conductive component 1, since the spring portion 7 is provided above this position, the molten solder does not reach the spring portion 7.

Accordingly, it does not happen that the spring portion 7 is buried in the solder to change properties of the spring portion 7. Further, solder cracks can be suppressed from occurring with deformation of the spring portion 7.

After the conductive component 1 is joined to the wiring pattern 8A of the printed wiring board 8 by soldering as above, the conductive component 1 is sandwiched between the printed wiring board 8 and a panel 9 formed of conductive material as shown in FIG. 2B, for example.

In such a process, the spring portion 7 is to be compressed while being elastically deformed. More specifically, in the spring portion 7, portions having U-shaped curved configurations are inwardly narrowed, and the two U-shaped portions are thereby forced to approach each other but inhibited by a crossbar between the U-shaped portions. As a result, the spring portion 7 bulges in an outer circumferential direction of the tubular body 3. In such a manner, the spring portion 7 is variously deformed locally and concurrently.

Consequently, in the spring portion 7, a force to push back the contact portion 6 toward a side of the panel 9 is generated, and the contact portion 6 is press-contacted to the panel 9 upon receiving the force. This results in formation of a conductive path between the printed wiring board 8 and the panel 9 via the conductive component 1.

According to the conductive component 1 as described above, processing such as folding back part of the tubular body 3 at a portion to be the spring portion 7 is unnecessary. Therefore, unlike a configuration in which a spring portion is formed by bending so as to fold back a metal plate, a problem that the spring portion 7 easily breaks at the folded-back part is suppressed from occurring.

Further, compared with the folded-back-type spring portion and the cut-and-raised-type spring portion, the tubular body 3 is allowed to have high stiffness due to its configuration. Therefore, when the conductive component 1 composed of the tubular body 3 as above is sandwiched, sufficiently high contact pressure can be easily secured.

Besides, by changing a size and shape of the notch 3A and the through-hole 3B as appropriate, the line width and design of the remaining portion can be variously changed, so that the stiffness of the spring portion 7 can be controlled. As a result, the contact pressure of the conductive component 1 can be lowered from the sufficiently high level to a desired level to promote optimization of the contact pressure.

Further, since the notch 3A and the through-hole 3B are formed at a position where the molten solder does not reach the spring portion, it is also possible to inhibit the solder raised due to surface tension from interfering with spring property of the spring portion 7, unlike a spring portion configured to stand up directly from the site of the solder joint portion.

Moreover, in the spring portion configured in such a manner that one end is a fixed end and the other end is a free end which is displaceable more than the one end, certain kinds of things (e.g., the operator's fingers) could be easily caught on the free end side, which is likely to result in troubles such as plastic deformation on the fixed end side of the spring portion. In contrast, in the conductive component 1, part of the tubular body 3 constitutes the spring portion 7 and, therefore, a possibility that certain kinds of things are caught is lowered compared with the spring portion having a protruding free end. As a result, improvement in workability, productivity, and the like can be expected.

In the present embodiment, in a state where the tubular body 3 is disposed with the solder joint portion 5 facing downward, the contact portion 6 facing upward, and both ends of the tubular body 3 facing to the right and to the left respectively, the notch 3A and the through-hole 3B are formed on both portions located at a front and at a rear of the tubular body 3. As a result, the both portions located at the front and at the rear become the pair of the spring portions 7, 7. Such a configuration can suppress an inclination of the contact portion 6 from varying when the contact portion 6 is displaced toward a side of the solder joint portion 5, compared with a configuration in which the same kind of spring portion is interposed at either one of the front portion and the rear portion. As a result, the contact portion 6 can maintain a stable contact state with the panel 9.

In the conductive component 1, since the portion to be the solder joint portion 5 and the portion to be the contact portion 6 have the same shape, when the conductive component 1 is stored in an embossed tape or the like, it becomes possible to perform a storing task without paying excessive attention to a storing direction of the conductive component. As a result, such a conductive component contributes to improvement in productivity.

Furthermore, in the conductive component 1, since the notch 3A and the through-hole 3B are formed with a laser beam machine, even if the conductive component 1 is very small, the notch 3A and the through-hole 3B can be formed with extremely high accuracy. Therefore, optimization of stiffness or elasticity in the spring portion 7 can be easily promoted by carefully adjusting a size and shape of the notch 3A and the through-hole 3B in accordance with required performance.

To give specific examples, as in conductive components 11, 21, 31, 41, 51, 61, 71, 81, 91, 101 shown in FIGS. 3A-3J, it is possible to change configurations of spring portions 17, 27, 37, 47, 57, 67, 77, 87, 97, 107 variously.

Each of the spring portions 17, 27, 37, 47, 57, 67, 77, 87, 97, 107 has somewhat different stiffness and different spring property. Therefore, a configuration of the spring portion may be selected in view of required contact pressure and the like.

In addition, when the tubular body 3 is processed with the laser beam machine, there is no stress left in a bent portion unlike a case of press working. Instead, even if residual stress has been generated for some reason when the tubular body is heated at a severed portion, the residual stress can even be relaxed.

Although the embodiment of the present invention has been described hereinabove, the present invention is not limited to the above specific embodiment but can be also implemented in various other configurations.

In the above embodiment, for example, although a tubular body having a closed cross-sectional shape, in which there is no open ring portion on the cross-section perpendicular to a penetration direction of the inner opening (a direction along an axial line L2 in FIGS. 1B and 1C), is used as the tubular body 3, the tubular body 3 may have an open cross-sectional shape, in which there is an open ring portion 115A on the cross-section perpendicular to the penetration direction of the inner opening (a direction along an axial line L3 in FIGS. 4A, 4B and 4D), as in a conductive component 111 shown in FIGS. 4A-4D.

Specifically, although the conductive component 111 is similar to the above-described conductive component 1 in terms of having a solder joint portion 115, a contact portion 116, and a spring portion 117, the solder joint portion 115 is configured to include the open ring portion 115A. Even such a configuration allows the conductive component 111 to function in an approximately similar manner to a case of the conductive component 1 of the above embodiment, once the solder joint portion 115 is fixed on a printed wiring board by solder jointing. This is because the open ring portion 115A is located in the solder joint portion 115.

Figure 4A:
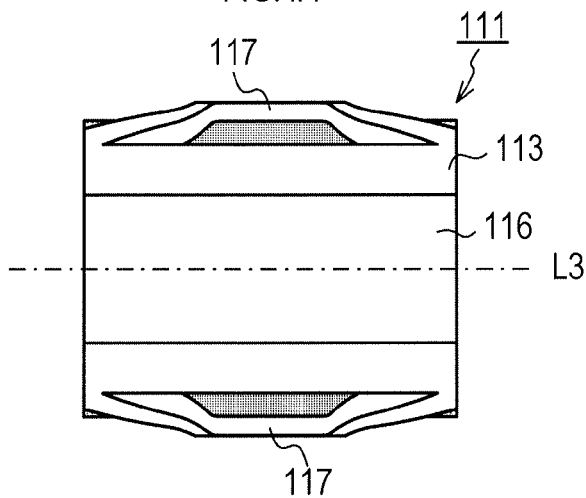
FIGS. 4A-4D are views showing a conductive component exemplified as another embodiment.
Figure 4B:
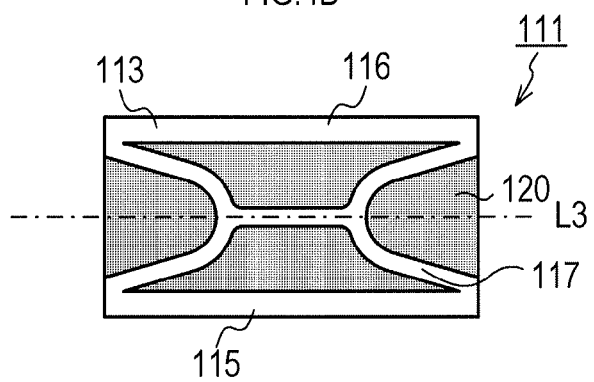
Figure 4C:
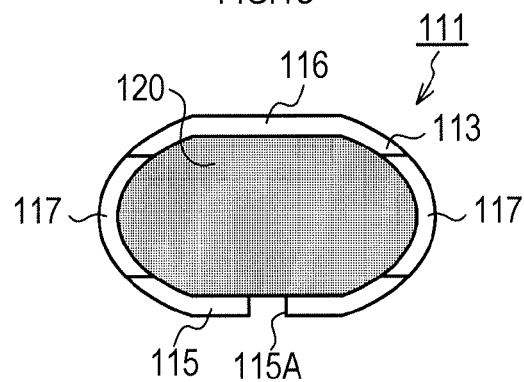
Figure 4D:
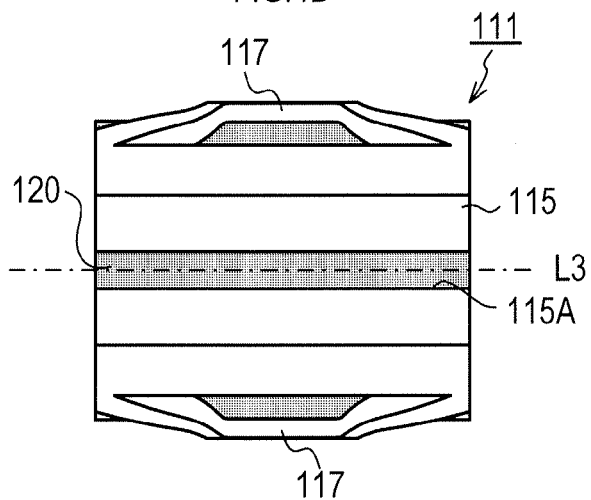

In the above embodiment, the tubular body 3 which is elliptical in cross-section is utilized as shown in FIG. 1D. However, as shown in FIG. 4C, flat portions may be formed on the solder joint portion 115 and the contact portion 116. In other words, the above-described conductive components are characterized in that each is manufactured based on a tubular body, and it is arbitrary whether a specific cross-sectional shape of the tubular body is elliptical or of other shape.

However, in order to make the solder joint portion face downward more surely at the time of surface mounting, it is preferable to adopt a configuration in which the spring portion does not face downward easily. As such a configuration, the cross-sectional shape is preferably elliptical, trapezoidal, rectangular, square and the like, for example.

Although, in the above embodiment, an example is shown in which an inside of the tubular body 3 is hollow, the tubular body 113 may have a configuration in which an elastic body 120 such as elastomer and sponge is filled inside the tubular body 113 as shown in FIGS. 4A-4D.

The above elastic body 120 can be disposed inside the through-hole in various manners as follows: by press-fitting the elastic body 120 such as elastomer and sponge after forming a through-hole on an outer peripheral surface of the tubular body; by setting the tubular body in a die after forming a through-hole on an outer periphery of the tubular body and then injecting material composition, which becomes elastic body 120 such as elastomer and sponge, into the die; or by forming an elastic body 120 such as elastomer and then wrapping a thin plate (e.g., a metal plate with a through-hole processed thereon), which is to be formed into a tubular body, around the elastic body 120.

By disposing the above elastic body 120 inside the tubular body 113, the tubular body 113 is supported by the elastic body 120 from inside thereof. As a result, more stable contact pressure is applied to a contact portion between the conductive component 1 and the other member, and electrical properties are thereby stabilized while the conductive component 1 is in use.

Although in the above embodiment, an example is shown in which the notch 3A and the through-hole 3B are formed on the metal tubular body 3 with the laser beam machine, it is also possible to form a notch and a through-hole, for example, by passing a mandrel through a metal tubular body and punching a surface of the tubular body by press working. Alternatively, a flat plate punched by press working may be rolled up into a cylindrical shape. When punching is performed by press working, a hole of a predetermined shape may be punched out as in a so-called punching metal, or a slitted portion may be expanded to be transformed into a hole as in a so-called expand metal. Any of these can be a conductive component having features of the present invention by being rolled up into a cylindrical shape.

In addition to the above metal tubular bodies, the tubular body may be formed of conductive resin material, or a surface of a tubular body formed of material with no or low conductivity may be coated with conductive material (e.g., a tubular body made by depositing a metal layer on an engineering plastic base material), as long as required stiffness, elasticity, and the like can be secured. In such cases, a tubular body with a notch and a through-hole can also be manufactured by metallic molding.

Although, in the above embodiment, the tubular body 3 includes the four notches 3A and the four through-holes 3B formed thereon, the numbers of the notches 3A and the through-holes 3B are not limited to four, respectively. In other words, it is sufficient for the tubular body 3 to include at least one of at least one such notch 3A and at least one such through-hole 3B.

Further, although, in the above embodiment, the tubular body 3 includes the pair of the spring portions 7, 7 formed thereon, it is sufficient for the tubular body 3 to include at least one such spring portion 7.

What is claimed is:

1. A conductive component which electrically connects two members when sandwiched therebetween, the conductive component comprising:
   a tubular body which includes a peripheral wall surrounding an inner opening which penetrates a central portion of the tubular body, from a first axial end to an opposite second axial end of the tubular body, and the tubular body being configured to be disposed between the two members so that the inner opening is at least partially collapsed by the peripheral wall during establishment of the electrical connection between the two members, and further includes at least one of:
      at least one through-hole which penetrates completely through the peripheral wall of the tubular body from outside to inside thereof; and
      at least one notch which is cut in from at least one of the first axial end and the second axial end of the tubular body, which are formed at at least one predetermined portion on the peripheral wall of the tubular body,
   wherein the tubular body includes:
   at least one spring portion which includes the at least one predetermined portion and a first portion of the peripheral wall and a second portion of the peripheral wall which are located on opposite sides from one another with the at least one spring portion sandwiched therebetween, the first portion including a solder joint portion which is joined to one of the two members by soldering and the second portion including a contact portion which contacts an other of the two members; and
   the at least one spring portion being at least partially elastically deformed to facilitate electrical contact between the contact portion and the other of the two members when the contact portion is displaced by engagement with the other of the two members toward the solder joint portion.

2. The conductive component according to claim 1, wherein, the at least one of the at least one through-hole and the at least one notch is formed on both of a pair of portions on the peripheral wall facing each other via the inner opening, so that each of the both of the pair of portions form the at least one spring portion.

3. The conductive component according to claim 2, wherein the tubular body has a rotationally symmetrical configuration with an axis line extending between the solder joint portion and the contact portion as a center of symmetry.

4. The conductive component according to claim 3, wherein a central portion of the contact portion is a suction surface that is attracted by a suction nozzle provided on an automatic mounting device when the automatic mounting device performs mounting.

5. The conductive component according to claim 4, wherein the suction surface is a curved surface corresponding to a side portion of the tubular body, which has either one of a circular shape and an elliptical shape in cross-section perpendicular to an axial direction.

6. The conductive component according to claim 1, wherein the first portion and the second portion have a same shape.

7. The conductive component according to claim 1, further comprising an elastic body, which is formed of one of elastomeric material and foamed material and disposed inside the tubular body.

8. The conductive component according to claim 1, wherein the tubular body is of metal, and
   the at least one of the at least one through-hole and the at least one notch is formed by a press machine.

9. The conductive component according to claim 1, wherein the tubular body is of metal, and
   the at least one of the at least one through-hole and the at least one notch is formed by a laser beam.

10. The conductive component according to claim 1, wherein the at least one spring portion is formed in the tubular body at a location such that solder avoids contact with the at least one spring portion when the solder joint portion is joined to the one of the two members by soldering.

11. The conductive component according to claim 1, wherein the tubular body further comprises an open cross-sectional shape in which there is an open ring portion on a cross-section of the tubular body perpendicular to a penetration direction of the inner opening.

12. The conductive component according to claim 11, wherein the open ring portion is included in the solder joint portion.

13. A conductive component electrically connecting first and second members with one another when the conductive component is sandwiched therebetween, the conductive component comprising:
   a generally tubular body being formed from a single unitary material and defining an axis and having an interior opening penetrates completely through a central portion of the tubular body,
   at least one spring portion comprising at least one of at least one through-hole defined in peripheral wall of the tubular body from an outside of the tubular body to an inside of the tubular body, and at least one notch cut in an edge of at least one of a first axial end and a second axial end of the tubular body,
   a solder joint portion being formed along a first peripheral wall portion, and
   the solder joint portion being joined with the first member by soldering,
   a contact portion being formed at a second peripheral wall portion, and the contact portion contacting the second member,
   the solder joint portion and the contact portion being axially aligned with one another, being located on circumferentially opposite sides of the tubular body, and being spaced apart from one another by the at least one spring portion,
   the at least one spring portion being at least partially elastically deformed as the contact portion engages with the second member so that the contact portion is displaced toward the solder joint portion during establishment of the electrical connection between the first and the second members.

14. The conductive component according to claim 13, wherein a surface of the first member defines a first plane, a surface of the second member defines a second plane, and the axis is parallel with one of the first plane and the second plane.

15. The conductive component according to claim 13, wherein a surface of the first member defines a first plane, a surface of the second member defines a second plane, and the axis is parallel with both the first plane and the second plane.

16. A conductive component which electrically connects first and second members with one another when the conductive component is sandwiched therebetween, the conductive component comprising:

a first peripheral wall portion, a second peripheral wall portion being aligned with the first peripheral wall portion and being spaced from the first peripheral wall portion by at least one spring portion, the first peripheral wall portion, the second peripheral wall portion and the at least one spring portion defining a single unitary tubular body having a central opening extending therethrough from a first open axial end to an opposed second open axial end, the at least one spring portion comprising at least one of at least one through-hole formed in the peripheral wall of the tubular body and extending completely therethrough, and at least one notch cut in an edge of at least one of the first and the second axial ends of the tubular body, the first peripheral wall portion having a solder joint portion for being solely joined to the first member by soldering, the second peripheral wall portion having a contact portion for solely engaging with the second member, the solder joint portion and the contact portion both being axially aligned with one another, being located on circumferentially opposite sides of the tubular body from one another, and being spaced apart from one another by the at least one spring portion, the at least one spring portion being at least partially elastically deformed when the contact portion engages with the second member so that the contact portion is displaced toward the solder joint portion, during establishment of the electrical connection between the first and the second members, and the central opening is at least partially collapsed.

* * * * *